US009209186B1

(12) United States Patent  (10) Patent No.: US 9,209,186 B1
Togo et al.  (45) Date of Patent: Dec. 8, 2015

(54) THRESHOLD VOLTAGE CONTROL FOR MIXED-TYPE NON-PLANAR SEMICONDUCTOR DEVICES

(71) Applicant: GLOBALFOUNDRIES Inc., Grand Cayman (KY)

(72) Inventors: Mitsuhiro Togo, Ballston Lake, NY (US); Changyong Xiao, Mechanicville, NY (US); Yiqun Liu, Clifton Park, NY (US); Dina H. Triyoso, Mechanicville, NY (US); Rohit Pal, Mechanicville, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/315,885

(22) Filed: Jun. 26, 2014

(51) Int. Cl.
| H01L 21/00 | (2006.01) |
| H01L 27/092 | (2006.01) |
| H01L 21/8238 | (2006.01) |
| H01L 21/324 | (2006.01) |
| H01L 21/265 | (2006.01) |
| H01L 21/321 | (2006.01) |
| H01L 21/8234 | (2006.01) |
| H01L 29/66 | (2006.01) |
| H01L 21/84 | (2006.01) |
| H01L 29/417 | (2006.01) |

(52) U.S. Cl.
CPC ...... *H01L 27/0924* (2013.01); *H01L 21/26513* (2013.01); *H01L 21/324* (2013.01); *H01L 21/32115* (2013.01); *H01L 21/823431* (2013.01); *H01L 21/823807* (2013.01); *H01L 21/823821* (2013.01); *H01L 21/823842* (2013.01); *H01L 21/845* (2013.01); *H01L 27/0922* (2013.01); *H01L 29/41791* (2013.01); *H01L 29/66795* (2013.01)

(58) Field of Classification Search
CPC ............... H01L 21/823431; H01L 21/823821; H01L 21/845; H01L 29/41791; H01L 29/66795
See application file for complete search history.

(56) References Cited

U.S. PATENT DOCUMENTS

| 2011/0284966 A1* | 11/2011 | Wen ................ H01L 21/823456 257/368 |
| 2012/0146159 A1* | 6/2012 | Wang .................. G03F 7/70633 257/410 |
| 2013/0037886 A1* | 2/2013 | Tsai ................ H01L 21/823821 257/351 |
| 2013/0200470 A1* | 8/2013 | Liu .................... H01L 29/66795 257/408 |
| 2013/0249010 A1* | 9/2013 | Ng .................. H01L 21/823842 257/369 |
| 2014/0070320 A1* | 3/2014 | Mukherjee ...... H01L 21/823456 257/368 |
| 2014/0183652 A1* | 7/2014 | Chern ................. H01L 21/3212 257/369 |
| 2014/0349452 A1* | 11/2014 | Wang .............. H01L 21/823468 438/238 |

(Continued)

*Primary Examiner* — Ngan Ngo
(74) *Attorney, Agent, or Firm* — Wayne F. Reinke, Esq.; Heslin Rothenberg Farley & Mesiti P.C.

(57) ABSTRACT

A range of lowest, low and regular threshold voltages are provided to three p-type devices and three n-type devices co-fabricated on a same substrate. For the p-type devices, the range is achieved for the lowest using an additional thick layer of a p-type work function metal in a gate structure and oxidizing it, the low Vt is achieved with the thick p-type work function metal alone, and the regular Vt is achieved with a thinner layer of the p-type work function metal. For the n-type devices, the lowest Vt is achieved by implanting tantalum nitride with arsenic, argon, silicon or germanium and not adding any of the additional p-type work function metal in the gate structure, the low Vt is achieved by not adding the additional p-type work function metal, and the regular Vt is achieved with a thinnest layer of the p-type work function metal.

13 Claims, 5 Drawing Sheets

(56) References Cited

U.S. PATENT DOCUMENTS

| | | | |
|---|---|---|---|
| 2015/0021672 A1* | 1/2015 | Chuang | H01L 29/42376 257/288 |
| 2015/0041855 A1* | 2/2015 | Liao | H01L 29/41791 257/192 |
| 2015/0069473 A1* | 3/2015 | Glass | H01L 21/02175 257/288 |
| 2015/0076624 A1* | 3/2015 | Liu | H01L 21/28079 257/412 |
| 2015/0214319 A1* | 7/2015 | Li | H01L 29/495 257/288 |
| 2015/0228647 A1* | 8/2015 | Chang | H01L 27/0886 257/401 |
| 2015/0228793 A1* | 8/2015 | Chen | H01L 29/7851 257/401 |

* cited by examiner

THRESHOLD VOLTAGE CONTROL FOR MIXED-TYPE NON-PLANAR SEMICONDUCTOR DEVICES

BACKGROUND OF THE INVENTION

1. Technical Field

The present invention generally relates to threshold voltage control for semiconductor devices, and, in particular, to common fabrication of mixed-type non-planar semiconductor devices having different threshold voltages.

2. Background Information

Current schemes for controlling threshold (i.e., turn-on) voltage (Vt) in semiconductor devices, such as transistors, include doping the channel. Although convenient, Vt control by channel doping quickly begins to degrade performance beyond very low levels of doping. Another current scheme to control Vt is the use of one or more layers of work function metal to achieve a desired Vt. However, this method is generally unstable for p-type devices, and the use of work function metal with n-type devices may further affect neighboring p-type devices. Thus, where mixed-type devices (i.e., n-type and p-type) are co-fabricated, using layers of work function metal alone is problematic. In addition, as device size continues to shrink, the amount of space in a gate stack remaining for the work function metal also decreases. Thus, the use of work function metal alone to adjust Vt has decreasing utility as device size decreases.

Therefore, a need continues to exist for threshold voltage control for mixed-type non-planar semiconductor devices.

SUMMARY OF THE INVENTION

The shortcomings of the prior art are overcome and additional advantages are provided through the provision, in one aspect, of a method of co-fabricating mixed-type non-planar semiconductor devices with different threshold voltages. The method includes providing a starting non-planar semiconductor structure, the starting structure including at least one non-planar p-type device in process and at least one non-planar n-type device in process, each device including a gate opening. The method further includes lining the gate openings with a multi-layer liner, the multi-layer liner including a bottom dielectric layer, a first layer of p-type work function metal over the dielectric layer and an etch stop layer over the first layer of p-type work function metal. The method further includes annealing the multi-layer liner, creating a layer of n-type work function metal over the multi-layer liner, and filling a remaining open area of the gate openings with at least one conductive material.

In a second aspect, a gate structure is provided. The gate structure includes a high-k dielectric layer lining inner surfaces of a gate opening of a non-planar semiconductor device, a first layer of p-type work function metal over the high-k dielectric layer, an etch stop layer over the first layer of p-type work function metal, a layer of n-type work function metal over the layer of barrier material, and a layer of conductive material over the layer of n-type work function metal, the conductive layer filling a remaining open space of the gate opening.

These, and other objects, features and advantages of this invention will become apparent from the following detailed description of the various aspects of the invention taken in conjunction with the accompanying drawings.

DETAILED DESCRIPTION OF THE INVENTION

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers are used throughout different figures to designate the same or similar components.

Figure 1:
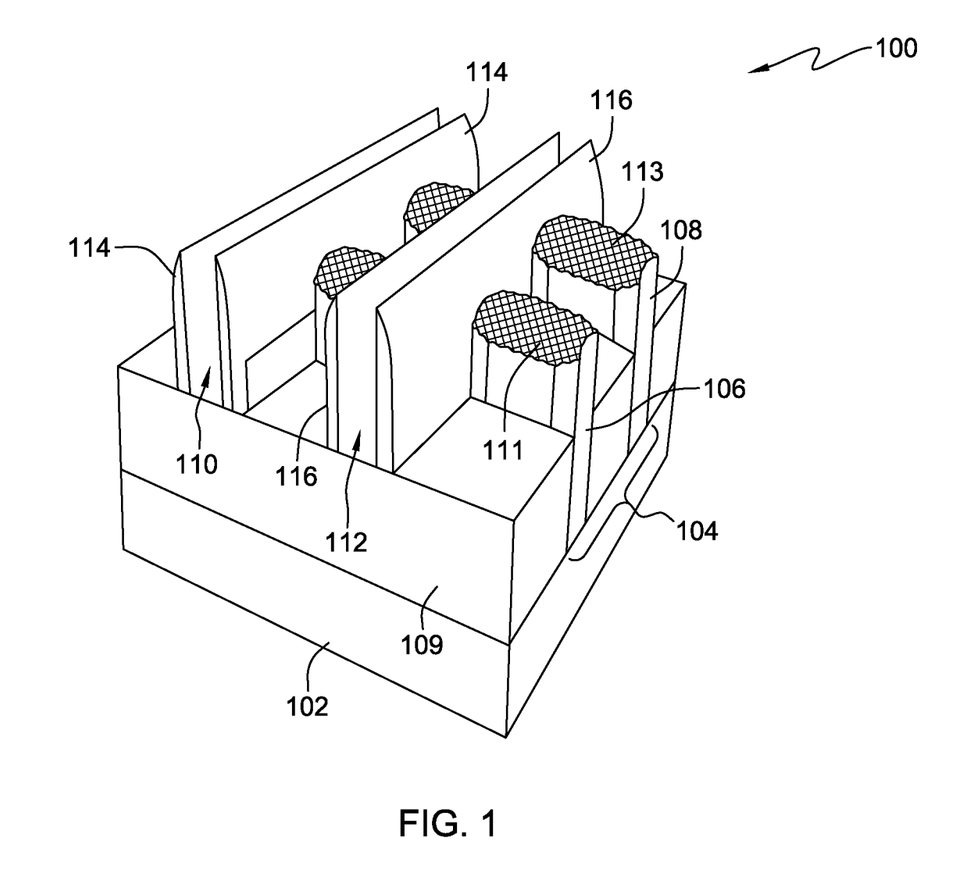
FIG. 1 depicts one example of a starting semiconductor structure including raised structures for both n-type and p-type devices with gate openings thereover, in accordance with one or more aspects of the present invention.

FIG. 1 depicts one example of a starting semiconductor structure 100, the structure including a substrate 102 and raised structures 104 coupled to the substrate, for both n-type 106 and p-type 108 devices, the raised structures surrounded by a layer 109 of an isolation material, and having gate openings 110 and 112, respectively, thereover, in accordance with one or more aspects of the present invention.

The starting structure may be conventionally fabricated, for example, using known processes and techniques. However, it will be understood that the fabrication of the starting structure forms no part of the present invention. Further, although only a portion is shown for simplicity, it will be understood that, in practice, many such structures are typically included on the same bulk substrate.

In one example, substrate 102 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 102 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

In one example, the raised structures 104 may take the form of a "fin." The raised structures may be etched from a bulk substrate, and may include, for example, any of the materials listed above with respect to the substrate. Further, some or all of the raised structures may include added impurities (e.g., by doping), making them n-type or p-type. In addition, the raised structures may have epitaxial structures 111 and 113 thereon, for example, silicon germanium for p-type devices and phosphorous-doped silicon for n-type devices. Further, the gate openings 110 and 112 may be defined by spacers 114 and 116.

Figure 2:
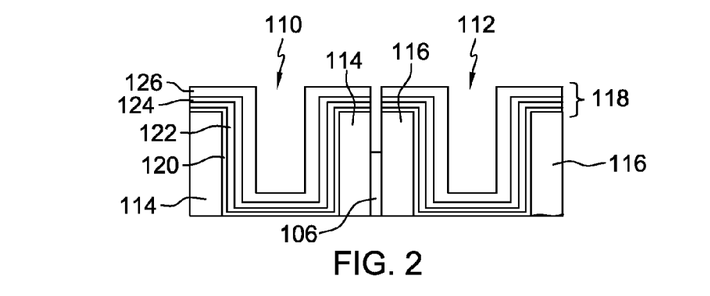
FIG. 2 depicts one example of the gate openings of the structure of FIG. 1 after creation of a multi-layer liner and an anneal thereof, in accordance with one or more aspects of the present invention.

FIG. 2 depicts one example of the gate openings 110 and 112 of the structure of FIG. 1 after creation of a multi-layer liner 118 and anneal thereof, in accordance with one or more aspects of the present invention.

In one example, the multi-layer liner 118 includes a bottom layer 120 of a dielectric material or interlayer oxide. The dielectric material is preferably a "high-k" dielectric (i.e., dielectric constant of more than 3.9), and may have a thickness of, for example, about 5 Angstroms to about 25 Angstroms, while the interlayer oxide may have a thickness of, for example, about 5 Angstroms to about 10 Angstroms. The multi-layer liner also includes a layer 122 of a p-type work function metal (e.g., titanium nitride (TiN)). Where TiN is used, layer 122 may have a thickness of, for example, about 5 Angstroms to about 15 Angstroms. The multi-layer liner further includes an etch stop layer 124, the etch stop function coming into use later in fabrication. The etch stop layer may include, for example, tantalum nitride (TaN) and may have a thickness of, for example, about 5 Angstroms to about 25 Angstroms. Finally, the multi-layer liner may include a layer 128 of amorphous silicon or polysilicon having a thickness of, for example, about 10 Angstroms to about 100 Angstroms. After creation of the multi-layer liner in all gate openings, the liner is annealed, for example, at a temperature of about 900° C. to about 1000° C. for about 1 millisecond to about 30 seconds.

Figure 3:
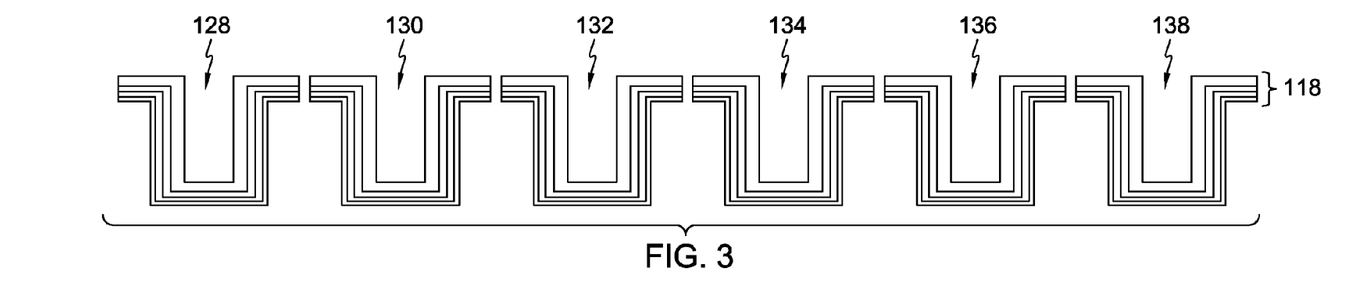
FIG. 3 depicts one example of the gate openings of FIG. 2 repeated three times, i.e., three gate openings for p-type devices (on the left) and three gate openings for n-type devices (on the right), in accordance with one or more aspects of the present invention.

FIG. 3 depicts one example of the gate openings of FIG. 2 repeated three times, i.e., three gate openings for p-type devices (on the left) 128, 130 and 132 and three gate openings for n-type devices (on the right) 134, 136 and 138, in accordance with one or more aspects of the present invention. The multiple gate openings all include multi-layer liner 118, and the fabrication process described below will give a range of threshold voltages Vt for each of the p-type device group and the n-type device group. In particular, going from left to right in FIG. 3, the p-type devices corresponding to gate openings 128, 130 and 132 will have a lowest Vt (e.g., about 0.05V to about 0.15V), a low Vt (e.g., above about 0.15V to about 0.25V) and a regular Vt (e.g., above about 0.25V to about 0.35V), respectively. Similarly, the n-type devices corresponding to gate openings 134, 136 and 138 will have a lowest Vt (e.g., about 0.05V to about 0.15V), a low Vt (e.g., above about 0.15V to about 0.25V) and a regular Vt (e.g., above about 0.25V to about 0.35V), respectively.

Figure 4:
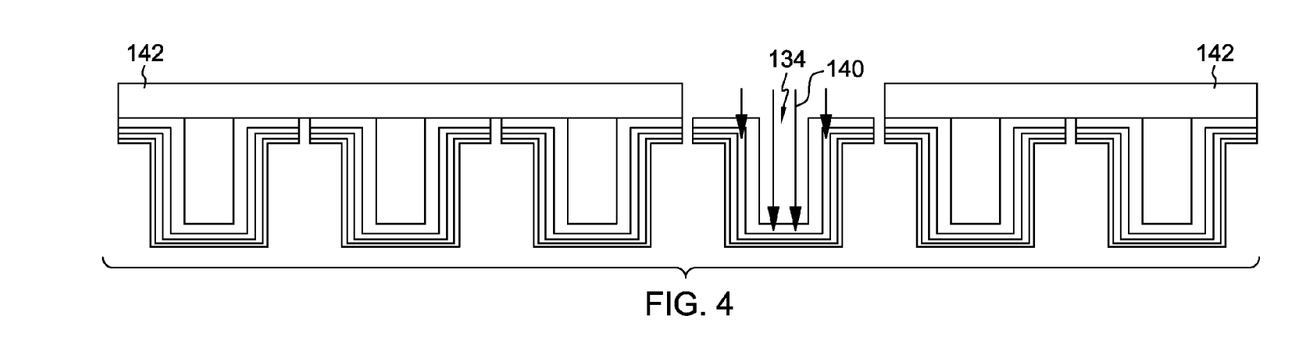
FIG. 4 depicts one example of the gate openings of FIG. 3 after implanting one of the n-type device gate openings with a n-type threshold voltage decrease material, in accordance with one or more aspects of the present invention.

FIG. 4 depicts one example of the gate openings of FIG. 3 after implanting 140 one of the n-type device gate openings 134 with a n-type threshold voltage decrease material, while protecting the remainder of the gate openings, in accordance with one or more aspects of the present invention.

The n-type threshold voltage decrease material may include, for example, arsenic (As), argon (Ar), silicon (Si) or germanium (Ge). In one example, the implant is implemented with about 1 KeV to about 5 KeV and about $1\ e^{15}/cm^2$ to about $6\ e^{15}/cm^2$. The remaining gate openings may be protected with, for example, a layer 142 of lithographic blocking material. The protective layer may be blanketly deposited over the gate openings, and etched over gate opening 134 using, for example, a conventional lithography process.

Figure 5:
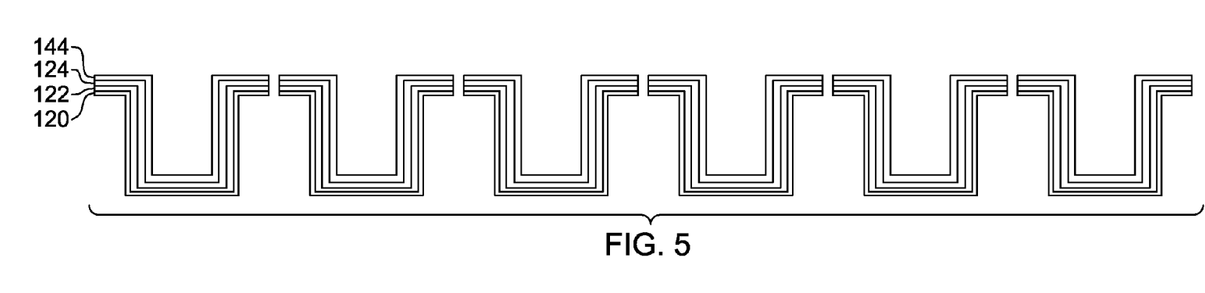
FIG. 5 depicts one example of the gate openings of FIG. 4 after creation of a first layer of p-type work function metal in all gate openings, in accordance with one or more aspects of the present invention.

FIG. 5 depicts one example of the gate openings of FIG. 4 after removal of layer 126 and creation of a first layer 144 of p-type work function metal in all gate openings, in accordance with one or more aspects of the present invention.

Layer 126 of amorphous silicon or polysilicon may be removed by, for example, wet etching using tetramethylammonium hydroxide (TMAH), dry etching using hydrogen bromide (HBr), or a combination of both wet and dry etching. After removal, which exposes etch stop layer 124, the layer 144 of p-type work function metal (e.g., TiN) may be created using, for example, Atomic Layer Deposition (ALD) or Chemical Vapor Deposition (CVD). The layer of work function metal may have a thickness of, for example, about 20 Angstroms to about 70 Angstroms.

Figure 6:
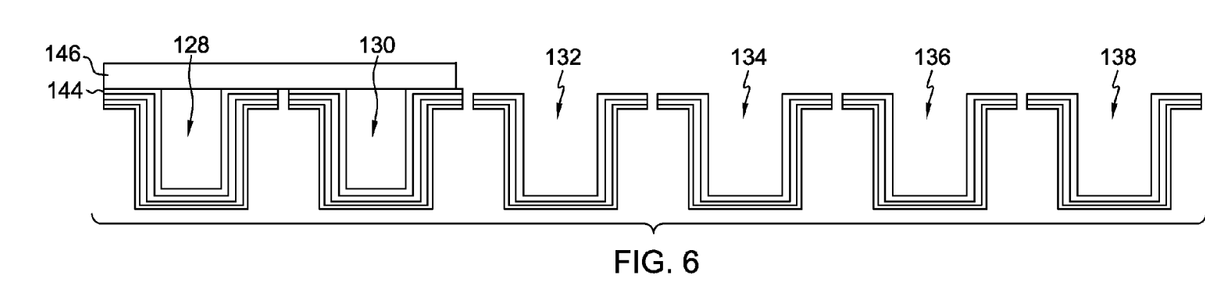
FIG. 6 depicts one example of the gate openings of FIG. 5 after removal of the first layer of p-type work function metal over all the n-type device gate openings and one of the p-type device gate openings, in accordance with one or more aspects of the present invention.

FIG. 6 depicts one example of the gate openings of FIG. 5 after removal of the first layer of p-type work function metal over all the n-type device gate openings 134, 136 and 138, and one of the p-type device gate openings 132 intended to have the regular threshold voltage of the p-type devices, while protecting the other p-type gate openings, in accordance with one or more aspects of the present invention.

In one example, where the p-type work function metal layer 144 includes TiN, it may be removed over gate openings 132, 134, 136 and 138 by, for example, dry etching using one or more of sulfur hexafluoride ($SF_6$), tetrafluoromethane ($CF_4$), boron trichloride ($BCl_3$) and/or chlorine gas ($Cl_2$). In another example, protection of gate openings 128 and 130 may be accomplished with a layer 146 of a lithographic blocking material.

Figure 7:
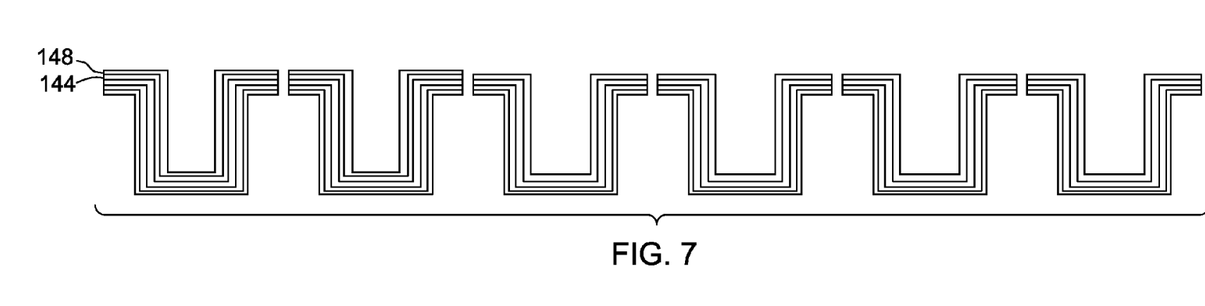
FIG. 7 depicts one example of the gate openings of FIG. 6 after creation of a blanket layer of additional p-type work function metal, in accordance with one or more aspects of the present invention.

FIG. 7 depicts one example of the gate openings of FIG. 6 after creation of a blanket layer 148 of additional p-type work function metal (e.g., TiN), in accordance with one or more aspects of the present invention. As with the first layer 144 of p-type work function metal, the additional layer may be created using, for example, ALD or CVD, and the additional layer may have a thickness of, for example, about 5 Angstroms to about 30 Angstroms.

Figure 8:
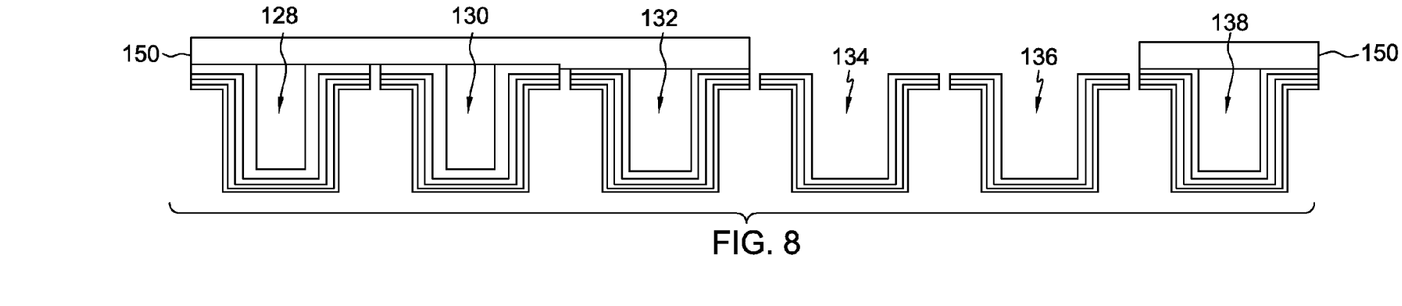
FIG. 8 depicts one example of the gate openings of FIG. 7 after removing the additional layer of p-type work function metal over two of the n-type device gate openings, in accordance with one or more aspects of the present invention.

FIG. 8 depicts one example of the gate openings of FIG. 7 after removing the additional layer of p-type work function metal over two of the n-type device gate openings 134 and 136, the corresponding n-type devices intended to have a lowest n-type Vt and a low n-type Vt, respectively, while protecting the remaining gate openings, in accordance with one or more aspects of the present invention.

In one example, where the p-type work function metal layer 144 includes TiN, it may be removed over gate openings 134 and 136 by, for example, dry etching with one or more of $SF_6$, $CF_4$, $BCl_3$, and/or $Cl_2$. In another example, protection of gate openings 128, 130, 132 and 138 may be accomplished with a layer 150 of a lithographic blocking material.

Figure 9:
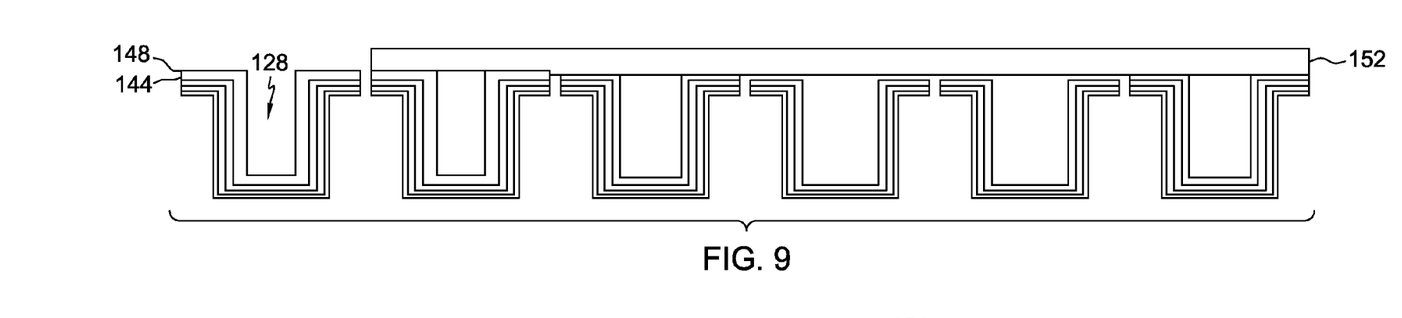
FIG. 9 depicts one example of the gate openings of FIG. 8 after oxidizing one of the p-type device gate openings while masking the rest of the devices, in accordance with one or more aspects of the present invention.

FIG. 9 depicts one example of the gate openings of FIG. 8 after oxidizing one of the p-type device gate openings 128, the corresponding p-type device intended to have a lowest p-type Vt, while masking the rest of the devices, in accordance with one or more aspects of the present invention.

Where the p-type work function metal layers 144 and 148 include TiN, the oxidizing may be accomplished, for example, with an oxygen gas ($O_2$) flow at a temperature of about 300° C. to about 500° C. In one example, masking of the remaining gate openings may be accomplished using a hard mask 152, e.g., silicon nitride (SiN). The mask may be created, for example, by blanket deposition of SiN, followed by etching the mask above gate opening 128, for example, wet etching using TMAH, dry etching using HBr, or a combination of both wet and dry etching.

Figure 10:
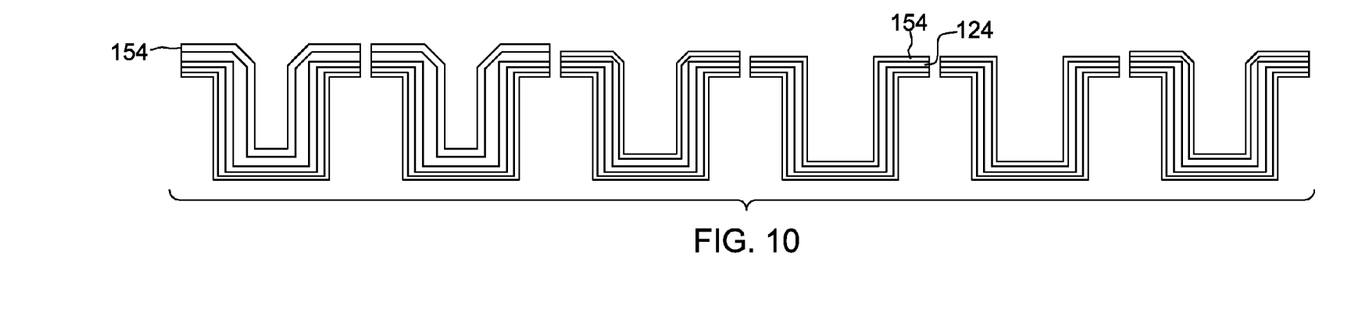
FIG. 10 depicts one example of the gate openings of FIG. 9 after creating a diffusion barrier layer over all the gate openings, in accordance with one or more aspects of the present invention.

FIG. 10 depicts one example of the gate openings of FIG. 9 after creating a diffusion barrier layer 154 over all the gate openings, in accordance with one or more aspects of the present invention. Preferably, prior to creation of the diffusion barrier layer, the remaining p-type work function metal is chamfered, and any gate opening that is chamfered for the p-type work function metal is also chamfered for the diffusion barrier layer.

The diffusion barrier layer may include, for example, TaN, may be created by, for example, ALD or CVD, and may have a thickness of, for example, about 5 Angstroms to about 25 Angstroms. The diffusion barrier layer is intended to prevent diffusion of a subsequent n-type work function metal, described with respect to FIG. 11.

Figure 11:
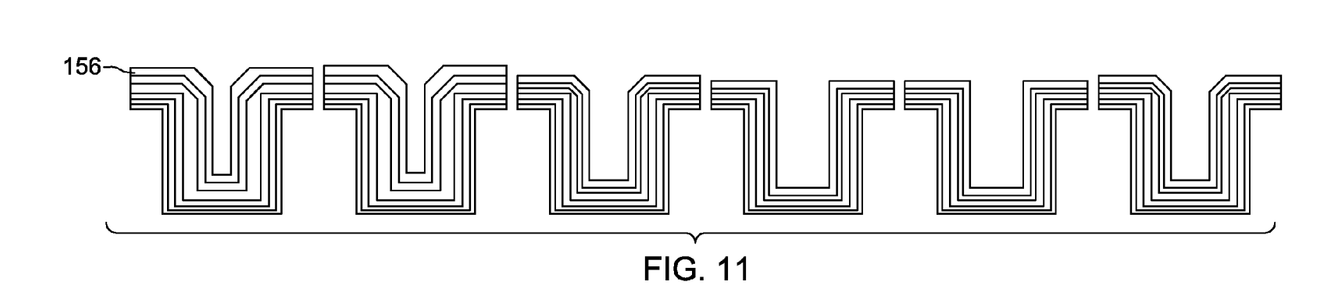
FIG. 11 depicts one example of the gate openings of FIG. 10 after creating a blanket layer of n-type work function metal, in accordance with one or more aspects of the present invention.

FIG. 11 depicts one example of the gate openings of FIG. 10 after creating a blanket layer 156 of n-type work function metal, in accordance with one or more aspects of the present invention. The n-type work function metal layer may include, for example, titanium aluminum (TiAl), may be created by, for example, ALD or CVD, and may have a thickness of, for example, about 20 Angstroms to about 70 Angstroms. Preferably, the n-type work function metal layer is chamfered.

Figure 12:
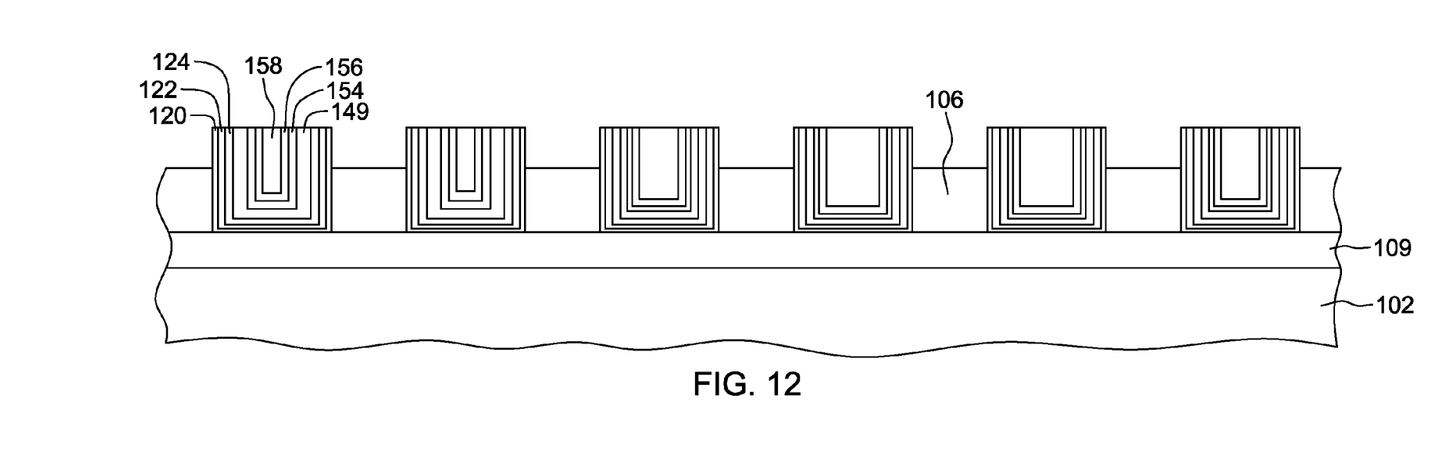
FIG. 12 depicts one example of the gate openings of FIG. 11 after filling the remaining space in the gate openings with a conductive material, in accordance with one or more aspects of the present invention.

FIG. 12 depicts one example of the gate openings of FIG. 11 after filling the remaining space in the gate openings with a conductive material 158 and planarizing, in accordance with one or more aspects of the present invention. The conductive material may be, for example, a metal, e.g., tungsten (W), and may be created using, for example, ALD or CVD. In one example, the planarizing is accomplished using chemical-mechanical polishing (CMP).

In a first aspect, disclosed above, is a method of co-fabricating mixed-type non-planar semiconductor devices with different threshold voltages. The method includes providing a starting non-planar semiconductor structure, the starting structure including at least one non-planar p-type device in process and at least one non-planar n-type device in process, and each device including a gate opening. The method further includes lining the gate openings with a multi-layer liner, the multi-layer liner including a bottom dielectric layer, a first layer of p-type work function metal over the dielectric layer and an etch stop layer over the first layer of p-type work function metal. The method further includes annealing the multi-layer liner, creating a layer of n-type work function metal over the multi-layer liner, and filling a remaining open area of the gate openings with at least one conductive material.

In one example, the multi-layer liner of the first aspect may further include a layer of amorphous silicon over the etch stop layer. Further, the method may include, after the lining and prior to creating the layer of n-type work function metal, implanting the multi-layer liner of the n-type device gate opening(s) with a n-type threshold voltage decrease material, and removing the layer of amorphous silicon. Prior to the implanting, the method may include creating a layer of lithographic blocking material over all the devices except for the n-type device gate opening(s). Implanting is also performed for the p-type device gate opening(s). Creating the second layer of p-type work function metal may include creating the second layer of p-type work function metal over only the p-type device gate opening(s).

In one example, the method of the first aspect may include creating a third layer of p-type work function metal over all the gate openings, oxidizing the third layer of p-type work function metal, and, prior to creating the second diffusion barrier layer, oxidizing the second and first layers of p-type work function metal over the p-type device(s) and corresponding gate opening(s).

In one example, the method of the first aspect may include, prior to the oxidizing, creating a hard mask over all the devices except the p-type device gate opening(s).

In one example, the method of the first aspect may include creating a layer of n-type work function metal over the second diffusion barrier layer. In addition, the method may include filling a remaining open area of the gate openings with a conductive material, and planarizing the filled gate openings.

In one example, lining the gate openings in the method of the first aspect may include creating a first additional layer of p-type work function metal over the etch stop layer for the p-type device(s), lining the gate openings may include creating a second additional layer of p-type work function metal over the first additional layer for the p-type device(s), and lining the gate openings may include oxidizing the first and second additional p-type work function metal layers for the p-type device(s).

In one example, lining the gate openings in the method of the first aspect may include implanting the etch stop layer with one of arsenic, argon, silicon and germanium, and creating a diffusion barrier layer over the etch stop layer for one or more of the at least one n-type device.

In one example, lining the gate openings in the method of the first aspect may include creating an additional layer of p-type work function metal over the etch stop layer for the n-type device(s).

In one example, lining the gate openings in the method of the first aspect may include creating a diffusion barrier layer over the etch stop layer.

In a second aspect, disclosed above, a gate structure for a non-planar semiconductor device is provided. The gate structure includes a high-k dielectric layer lining inner surfaces of a gate opening of a non-planar semiconductor device, a first layer of p-type work function metal over the high-k dielectric layer, an etch stop layer over the first layer of p-type work function metal, a layer of n-type work function metal over the layer of barrier material, and a layer of conductive material over the layer of n-type work function metal, the conductive layer filling a remaining open space of the gate opening.

In one example, the gate opening of the gate structure of the second aspect may include a gate opening of a p-type non-planar semiconductor device, the gate structure further including a diffusion barrier layer and at least one second layer of p-type work function metal between the diffusion barrier layer and the second layer of p-type work function metal. Additionally, the second layer of p-type work function metal may be oxidized.

In one example, the gate opening of the gate structure of the second aspect may further include a gate opening of a n-type non-planar semiconductor device, the gate structure also being present in the n-type device gate opening.

In one example, the gate opening of the gate structure of the second aspect may include a gate opening of a n-type non-planar semiconductor device, the barrier layer including a first barrier layer and a second barrier layer, and the gate structure further including a second layer of p-type work function metal between the first and second barrier layers.

In one example, the gate opening of the gate structure of the second aspect may include a gate opening of a n-type non-planar semiconductor device, and a lower portion of the barrier layer may be implanted with a material that lowers n-type threshold voltage, for example, one of arsenic, argon, silicon and germanium.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method, comprising:
providing a starting non-planar semiconductor structure, the starting structure comprising at least one non-planar p-type device in process and at least one non-planar n-type device in process, each device comprising a gate opening;
lining the gate openings with a multi-layer liner, the multi-layer liner comprising a bottom dielectric layer, a first layer of p-type work function metal over the dielectric layer and an etch stop layer over the first layer of p-type work function metal;
annealing the multi-layer liner;
creating a layer of n-type work function metal over the multi-layer liner; and
filling a remaining open area of the gate openings with at least one conductive material.

2. The method of claim 1, wherein the multi-layer liner further comprises a layer of amorphous silicon over the etch stop layer, the method further comprising, after the lining and prior to creating the layer of n-type work function metal:
implanting the multi-layer liner of one or more of the at least one n-type device gate opening with a n-type threshold voltage decrease material; and
removing the layer of amorphous silicon.

3. The method of claim 2, further comprising, prior to the implanting, creating a layer of lithographic blocking material over all the devices except for the one or more of the at least one n-type device gate openings.

4. The method of claim 2, wherein the implanting is also performed for the at least one p-type device gate opening.

5. The method of claim 4, wherein creating the second layer of p-type work function metal comprises creating the second layer of p-type work function metal over only the at least one p-type device gate opening, the method further comprising:
creating a third layer of p-type work function metal over all the gate openings; and
oxidizing the third layer of p-type work function metal.

6. The method of claim 1, further comprising, prior to creating the second diffusion barrier layer, oxidizing the second and first layers of p-type work function metal over one or more of the at least one p-type device and corresponding gate opening.

7. The method of claim 6, further comprising, prior to the oxidizing, creating a hard mask over all the devices except the one or more of the at least one p-type device gate openings.

8. The method of claim 1, further comprising creating a layer of n-type work function metal over the second diffusion barrier layer.

9. The method of claim 8, further comprising:
   filling a remaining open area of the gate openings with a conductive material; and
   planarizing the filled gate openings.

10. The method of claim 1, wherein lining the gate openings further comprises:
   creating a first additional layer of p-type work function metal over the etch stop layer for one or more of the at least one p-type device;
   creating a second additional layer of p-type work function metal over the first additional layer for at least one of the one or more of the at least one p-type device; and
   oxidizing the first and second additional p-type work function metal layers for one or more of at least one of the one or more of the at least one p-type device.

11. The method of claim 1, wherein lining the gate openings further comprises:
   implanting the etch stop layer with one of arsenic, argon, silicon and germanium; and
   creating a diffusion barrier layer over the etch stop layer for one or more of the at least one n-type device.

12. The method of claim 1, wherein lining the gate openings further comprises creating an additional layer of p-type work function metal over the etch stop layer for one or more of the at least one n-type device.

13. The method of claim 1, wherein lining the gate openings further comprises creating a diffusion barrier layer over the etch stop layer.

* * * * *